United States Patent [19]
Ghoshal

[11] Patent Number: 6,105,381
[45] Date of Patent: Aug. 22, 2000

[54] METHOD AND APPARATUS FOR COOLING GMR HEADS FOR MAGNETIC HARD DISKS

[75] Inventor: Uttam Shyamalindu Ghoshal, Austin, Tex.

[73] Assignee: International Business Machines Corporation, Armonk, N.Y.

[21] Appl. No.: 09/282,272

[22] Filed: Mar. 31, 1999

[51] Int. Cl.[7] .................................................. F25D 23/12
[52] U.S. Cl. ............................. 62/259.2; 62/3.7; 62/3.2
[58] Field of Search ..................... 62/259.2, 3.7, 62/3.2

[56] References Cited

U.S. PATENT DOCUMENTS

| | | | |
|---|---|---|---|
| 3,757,530 | 9/1973 | Doyle et al. | 62/117 |
| 5,456,081 | 10/1995 | Chrysler et al. | 62/3.7 |
| 5,676,199 | 10/1997 | Lee | 165/80.3 |
| 5,704,212 | 1/1998 | Erler et al. | 62/3.2 |
| 5,724,818 | 3/1998 | Iwata et al. | 62/3.7 |

FOREIGN PATENT DOCUMENTS

WO 00/08693   2/2000   WIPO ............................. H01L 35/34

*Primary Examiner*—Henry Bennett
*Assistant Examiner*—Chen-Wen Jiang
*Attorney, Agent, or Firm*—Casimer K. Salys; Felsman, Bradley, Vaden, Gunter & Dillon, LLP

[57] ABSTRACT

A thermoelectric cooling (TEC) device is thermally coupled, in close proximity, to a GMR head chip. When power is applied to the TEC device, heat is extracted from the GMR head chip by heat transfer to the cold end of the TEC device and rejected by heat pipes or cooling fins along the slider arm, in one embodiment. In another embodiment, a TEC device is integrated with the GMR head chip such that the cold end of the TEC device is physically and thermally coupled with the GMR head chip. Heat is transferred from the GMR head chip to a thermal spreader pad on the 'hot' end of the integrated GMR/TEC device.

21 Claims, 5 Drawing Sheets

METHOD AND APPARATUS FOR COOLING GMR HEADS FOR MAGNETIC HARD DISKS

BACKGROUND OF THE INVENTION

1. Technical Field

The present invention relates, in general, to data processing systems and in particular to data storage devices within a data processing system. More particularly, the present invention relates to problems associated with elevated temperatures within data storage devices, including high density hard disk drives.

2. Description of the Related Art

The need for higher density hard disk drives has been increasing every year. Development of magnetoresistive (MR) sensors (also referred to as heads) for disk drives in the early 1990's allowed disk drive products to offer a maximum storage capacity with a minimum number of components (heads and disks). Fewer components mean lower storage costs, higher reliability and lower power requirements.

MR sensors are used to read magnetically encoded information from a magnetic medium by detecting magnetic flux stored in the magnetic medium. During operation, sense current is passed through the MR element of the sensor, causing a voltage drop. The magnitude of the voltage drop is a function of the resistance of the MR element. Resistance of the MR element varies in the presence of a magnetic field. As the magnitude of the magnetic field flux passing through the MR element varies, the voltage across the MR element also varies. Differences in the magnitude of the magnetic flux entering the MR sensor can be detected by monitoring the voltage across the MR element.

MR sensors are known to be useful in reading data with a sensitivity exceeding that of inductive or other thin film sensors. However, the development of Giant Magnetoresistive (GMR) sensors (also referred as GMR head chips) greatly increased the sensitivity and the ability to read densely packed data. The GMR effect utilizes a spacer layer of a non-magnetic metal (chosen to ensure coupling between magnetic layers is weak) between two magnetic metals. GMR disk drive sensors (or head chips) operate at low magnetic fields and when the magnetic alignment of the magnetic layers is parallel the overall resistance is relatively low. When the magnetic alignment of the layers is anti-parallel, the overall resistance is relatively high. Physical stress in the sensor caused by the anti-parallel alignment increases electrical resistance and current in the GMR sensor causing the sensor to heat up. Also, heat from other components within the disk drive combine with the heat generated by the sensor to further increase temperature.

As GMR sensors allow extremely high data densities on disk drives, a stable sensor is essential to accurate read and write operations in high track density hard disk drives. It is known that temperature increases may cause the GMR sensor within the GMR element to exhibit unstable magnetic properties and efforts to reduce the temperature within the disk drive are ongoing. Cooling GMR sensors and other components within the hard disk drive increases sensitivity and improves read/write performance of the GMR sensor. Various methods of cooling hard disk drive components are known and include forced air, cooling fans, cooling fins, heat pipes, etc. Generally, the cooling methods have been limited to attaching materials or structures that have high thermal conductivities to transfer heat away from the sensor. However, due to space limitations and ambient conditions elaborate means of cooling are generally not available to the GMR sensor.

Therefore, it is desirable to provide a method for cooling GMR heads and other components in hard disk drives, that would be practical and fit within the subject structure without requiring serious structural changes to the hard disk drive. Cooling GMR head chips would significantly enhance magnetic sensing capacity of GMR head chips during the read operation and increase performance of the write operation. It would also be desirable to provide a practical method for cooling GMR heads that would allow utilization of GMR materials that have significantly higher sensitivities. Additionally, since other heat producing components within the data storage device may materially affect performance of the device's read/write sensors and it would be desirable to provide a method that would reduce heat generated by the other components.

SUMMARY OF THE INVENTION

It is therefore one object of the present invention to provide a method and apparatus for cooling GMR sensors in hard disk drives to enhance magnetic sensing capacity of GMR elements.

It is another object of the present invention to provide a method and apparatus for cooling GMR sensors to allow for use of significantly higher GMR material sensitivities.

It is yet another object of the present invention to provide a method and apparatus that enables increased data density and/or higher speed sensing by a GMR sensor.

The foregoing objects are achieved as is now described. A thermoelectric cooling (TEC) device is thermally coupled, in close proximity, to a GMR head chip or data storage device component. Heat is extracted from the GMR head chip by heat transfer to a cold end of the TEC device and rejected by heat pipes or cooling fins along a slider arm, in one embodiment. In another embodiment, a TEC device is integrated with the GMR head chip such that the cold end of the TEC device is physically and thermally coupled with the GMR head chip. Heat is transferred from the GMR head chip to a thermal spreader pad on the hot end of the integrated GMR/TEC device.

The above as well as additional objects, features, and advantages of the present invention will become apparent in the following detailed written description.

BRIEF DESCRIPTION OF THE DRAWINGS

The novel features believed characteristic of the invention are set forth in the appended claims. The invention itself however, as well as a preferred mode of use, further objects and advantages thereof, will best be understood by reference to the following detailed description of an illustrative embodiment when read in conjunction with the accompanying drawings, wherein:

DETAILED DESCRIPTION OF THE PREFERRED EMBODIMENT

Figure 1:
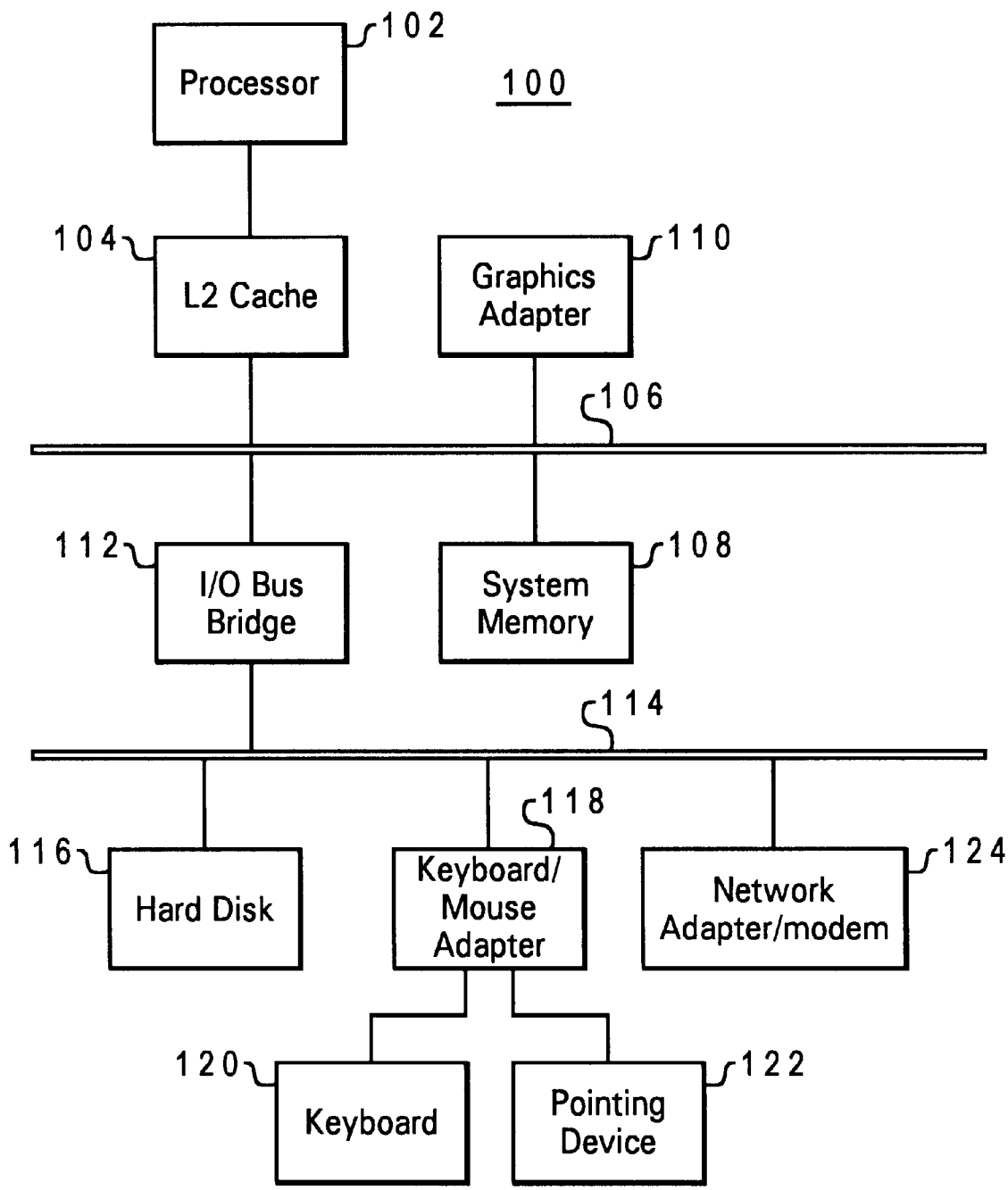
FIG. 1 depicts a high-level block diagram of a data processing system in which a preferred embodiment of the present invention may be implemented.

With reference now to the figures, and in particular with reference to FIG. 1, a high-level block diagram of a data processing system in which a preferred embodiment of the present invention may be implemented, is depicted. Data processing system 100 in the exemplary embodiment includes a processor 102, which may be a PowerPC™ processor available from International Business Machines Corporation of Armonk, N.Y. Processor 102 is connected to a level two (L2) cache 104, which is utilized to stage data to and from processor 102 at reduced access latency. L2 cache 104 is connected in turn to an interconnect or system bus 106, which is also connected, in the embodiment depicted, to system memory 108 and memory-mapped graphics adapter 110. Graphics adapter 110 provides a connection for a display device (not shown) on which the user interface of software executed within data processing system 100 is displayed.

Also connected to system bus 106 in the exemplary embodiment is input/output (I/O) bus bridge 112, which provides an interface between system bus 106 and I/O bus 114. A nonvolatile memory such as hard disk drive 116 may be connected to I/O bus 114, as may keyboard/mouse adapter 118, which provides connection to I/O bus 114 for keyboard 120 and pointing device 122. Pointing device 122 may be a mouse, trackball, or the like. Also connected to I/O bus 114 may be network adapter 124 for connecting data processing system 100 to a local area network (LAN), the Internet, or both. Those skilled in the art will appreciate that other devices may be incorporated into data processing system 100, such as an optical disk drive or a modem.

The operation of data processing systems of the type depicted in FIG. 1 is well known in the art. Program information comprising instructions and/or data is stored on nonvolatile memory 116 and may be selectively copied into system memory 108 once data processing system 100 is powered on. Processor 102 executes the instructions within such program information and generates text or graphical information for presentation on a display device connected via graphics adapter 110, where the information may be viewed by a user. The user may selectively control operation of data processing system 100 through input entered on keyboard 120 or through pointing device 122.

Figure 2:
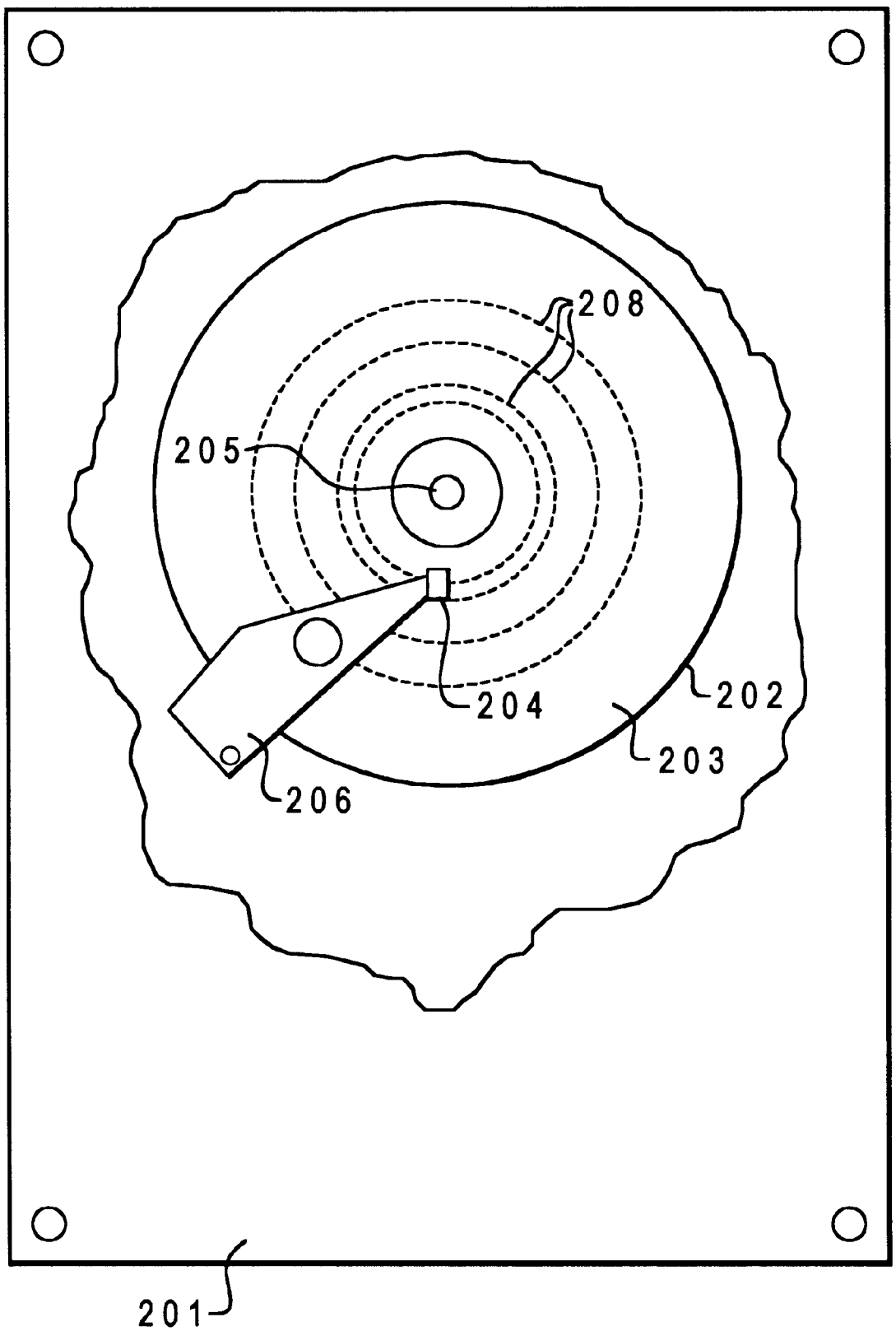
FIG. 2 is a cut-away, top plan view of a data storage system in accordance with a preferred embodiment of the present invention.

Referring now to FIG. 2, a cut-away, top plan view of a data storage system in accordance with a preferred embodiment of the present invention, is illustrated. Data storage system 200, includes a housing 202 containing at least one rotatable data storage disk 202 supported on a spindle 205 and rotated by a drive motor (not shown). Typically, a data storage system will comprise a plurality of disks and a slider 206 with a read/write head 204 for each disk. As an example, in a magnetic disk storage device, each data storage disk 202 has the capability of receiving and retaining data, through the use of a magnetic recording medium formed on at least one disk surface 203, where the magnetic recording medium is arranged in an annular pattern of multiple concentric data tracks 208. Though only a few data tracks 208 are shown, it is known that the number of tracks varies according to at least the recording medium and the read/write head 204. At least one slider 206, including one or more read/write heads 204 is positioned over data storage disk 202. Slider 206 is suspended from an actuator arm (not shown) by a suspension (also not shown) and the radial position of slider 206 with respect to data tracks 208 of data storage disk 202, is controlled by a voice coil motor (not shown).

During operation of data storage system 200, the rotation of data storage disk 202 generates an air bearing between slider 206 and disk surface 203. The air bearing counterbalances a slight downward-biased spring force of the suspension and supports slider 206 above disk surface 203 by a small, substantially constant spacing. As disk 202 is rotated by the drive motor, slider 206 is moved radially in and out in response to the movement of the actuator arm by the voice coil motor, permitting read/write head 204 to read and write data from and to the concentric tracks 208. Though only one read/write head 204 and slider 206 assembly is shown, it is well known that a plurality of sliders 206 may be employed to access a plurality of disks 202, stacked one atop the other on spindle 205.

The temperature of read/write head 204 may rise during operation of data storage drive 200 due to previously discussed magnetic field changes and ambient conditions in data storage system 200. During operation, read/write head 204, passes through magnetic field changes induced by stored data in the magnetic medium of disk 202. Temperature increases in read/write head 204 may be caused by the magnetic field changes encountered, along with the sensing current, while passing over the surface of disk 202. As read/write head 204 passes over magnetically encoded data in the form of bits, the changing magnetic fields encountered by read/write head 204 causes head resistance to change, which generates heat within read/write head 204. Magnetic instability may arise in read/write head 204 due to increasing read/write head 204 temperature. Magnetic instability causes noise and, concurrently, distortions in a current flow pattern in an active region (area (not shown) between bias field conductors of read/write head 204). A TEC device, may be mounted in close proximity to read/write head 204 to provide an active heat transfer device. Also, the TEC device may utilize a separate power source or in very low temperature conditions, the same power source as the read/write head.

TEC devices are used to cool many heat producing components such as; blood analyzers, lasers, microprocessors, etc. TECs may be coupled in series and parallel to increase heat extraction efficiency and dramatically decrease the temperature of a heat source.

Figure 3:
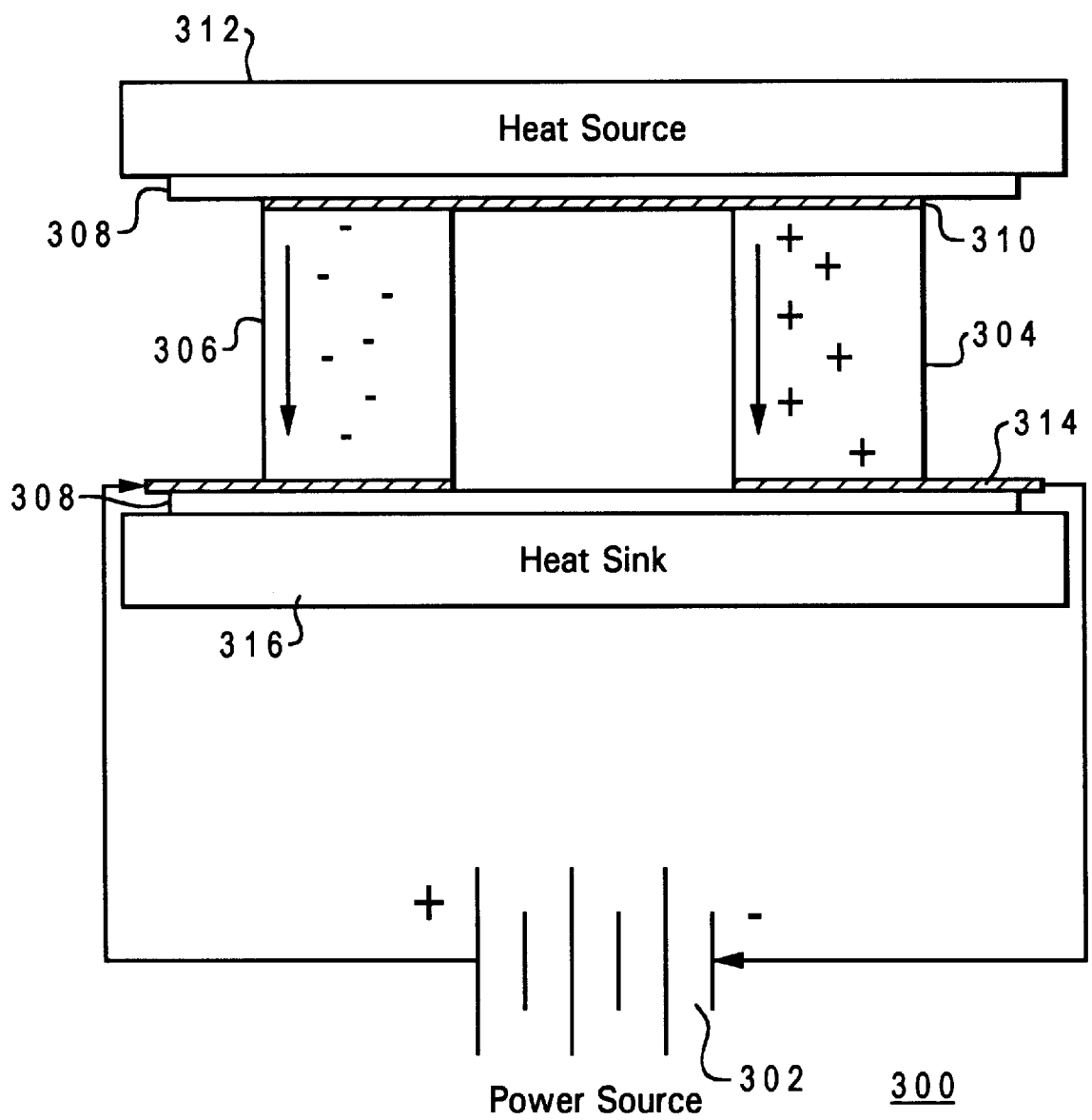
FIG. 3 depicts a high-level block diagram of a Thermoelectric Cooling (TEC) device.

Referring to FIG. 3, a high-level block diagram of a Thermoelectric Cooling (TEC) device is depicted. Thermoelectric cooling, a well known principle, is based on the Peltier Effect, by which DC current from power source 302 is applied across two dissimilar materials and causes a temperature differential. A typical thermoelectric cooling device utilizes p-type semiconductor 304 and n-type semiconductor 306 sandwiched between poor electrical conductors 308 that have good heat conducting properties. N-type semiconductor 306 has an excess of electrons, while p-type semiconductor 304 has a deficit of electrons.

As electrons move from p-type semiconductor 304 to n-type semiconductor 306 via electrical conductor 310, the energy state of the electrons is raised due to heat energy absorbed from heat source 312. This process has the effect of transferring heat energy from heat source 312 via electron flow through p-type semiconductor 304 and electrical conductor 314 to heat sink 316 where the electrons drop to a lower energy state and release the heat energy.

Figure 4:
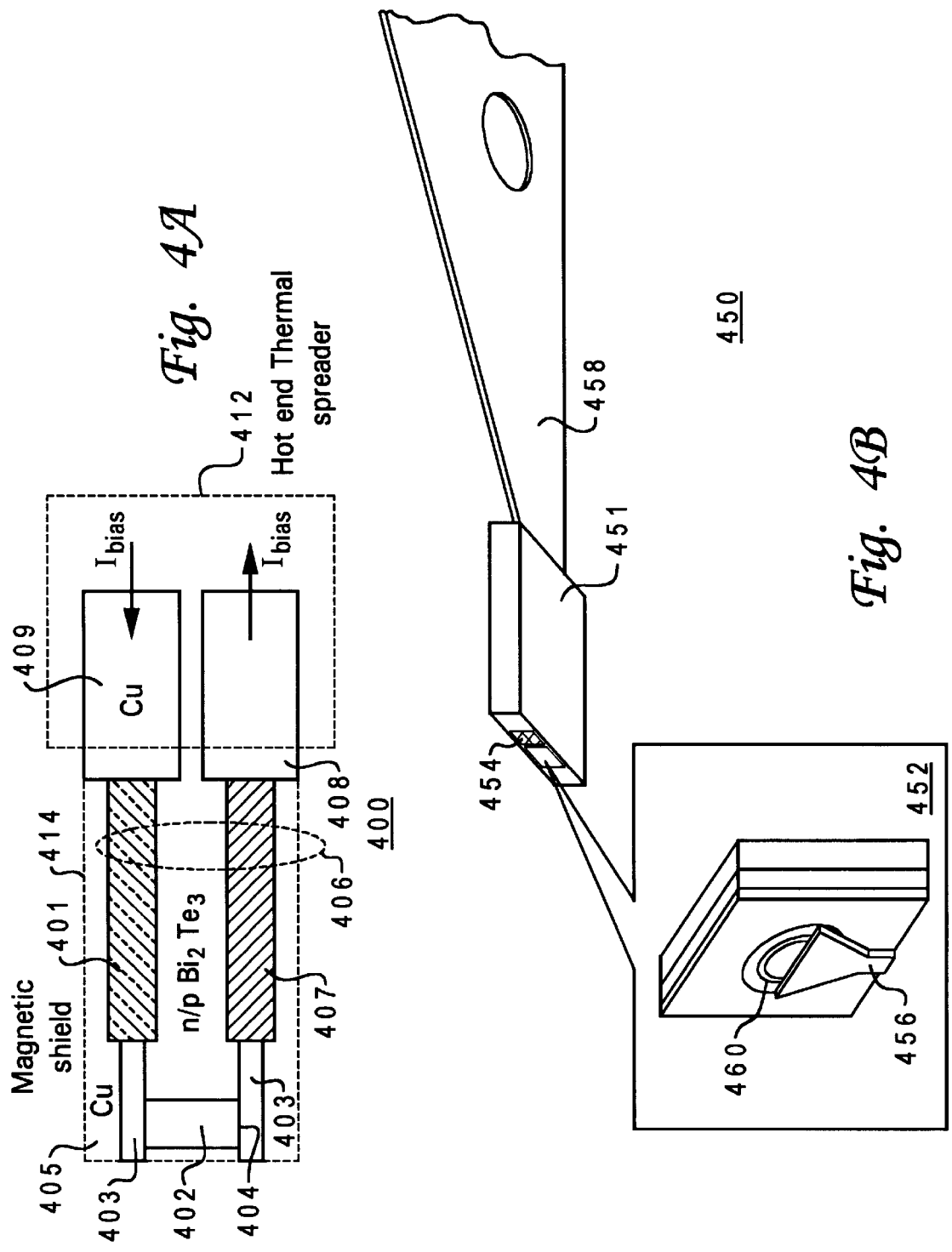
FIGS. 4A and 4B depict high-level block diagrams of a GMR head utilizing a TEC device in accordance with a preferred embodiment of the present invention.

Referring to FIGS. 4A and 4B, high-level block diagrams of a GMR head utilizing a TEC device in accordance with a preferred embodiment of the present invention, are depicted. In FIG. 4A, a high-level block diagram of an embodiment with an integrated thermoelectric cooling device in accordance with a preferred embodiment of the present invention is depicted. Giant Magnetoresistive, Thermoelectrically Cooled (GMR/TEC) head 400 includes thermoelectric cooling (TEC) device 406 which is monolithically integrated with GMR head chip 402 and heat transfer medium 404 in thermal contact with GMR head chip 402 and TEC device 406. TEC device 406, in this embodiment, is composed of n-type 401 and p-type 407 semiconductor material with a high thermoelectric "figure-of-merit" (ZT). The figure of merit ZT is defined by the factor $\alpha^2 \sigma T/\lambda$, where $\alpha$ (alpha) is the Seebeck coefficient that represents the entropy per unit electron or hole, $\sigma$ (sigma) is the electrical conductivity, T is the absolute temperature, and $\lambda$ (lambda) is the thermal conductivity.

Power is applied in a manner to cause TEC device 406 to exhibit a cold end 403 and a hot end 409. Cold end 403 of TEC device 406, due to the effect discussed in FIG. 3, decreases in temperature after power has been applied, thus providing a heat transfer means for GMR head chip 402. Heat transfer pads 408 and 410 receive thermal energy via p-type 401 and n-type semiconductor 407 and transfer the heat to thermal spreader 412. Holes present in P-type semiconductor 401 extracts energy from copper layer 405 which has received thermal energy from GMR head chip 402. Magnetic shield 414 is in place to reduce the effect interacting magnetic fields may have on GMR head chip 402.

Referring now to FIG. 4B, an embodiment with a thermoelectric cooling device in close proximity to the GMR head chip, in accordance with a preferred embodiment of the present invention, is illustrated. Suspended slider arm 450 includes arm 458 and GMR head 451. Not shown is the sensor conductors which lead from GMR head chip 452 and conductors for supplying power to TEC device 454. TEC device 454 is enclosed in GMR head 451 in close proximity to GMR head chip 452. GMR head chip 452 includes inductive write head 456 and write coils 460. GMR head chip 452 and TEC device 454 are thermally connected by a heat transfer medium with very high thermal conductivity (for instance, diamond film has high thermally conductive properties and is an excellent electrical insulator). Power, either from a separate or the same power source as the read/write head, is applied to TEC device 454 in a manner sufficient to cause TEC device 454 to exhibit a cold end and a hot end. Heat is transferred from GMR head chip 452 to the cold end of TEC device 454 which in turn, transfers from the hot end of TEC device 454 along arm 451 by heat pipes (not shown) or cooling fins (not shown).

All processes to fabricate the described embodiments, in FIGS. 4A and 4B, of the present invention are known in the art.

Figure 5:
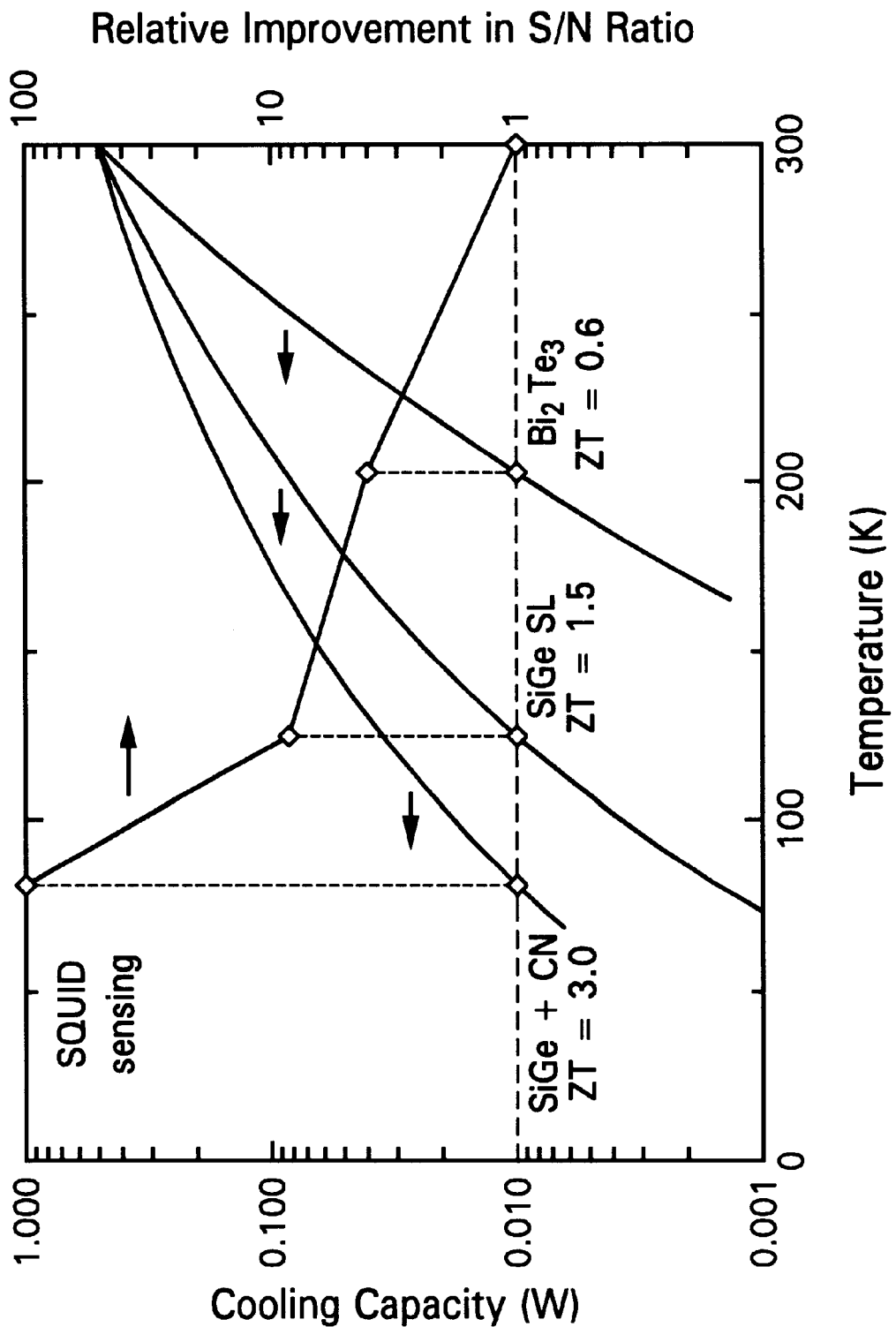
FIG. 5 depicts a graph of cooling capacity and signal-to-noise ratio improvement provided by three configurations of TEC devices in accordance with a preferred embodiment of the present invention.

Referring now to FIG. 5, a graph of cooling capacity and signal-to-noise ratio improvement provided by three configurations of TEC devices, in accordance with a preferred embodiment of the present invention, is depicted. Cooling capacity is plotted against temperature. Additionally, Relative Improvement in Signal to Noise (S/N) ratio is shown relative to cooling capacity. Bismuth Telluride and Bismuth Telluride doped with Antimony (Sb) currently have the highest ZT (ZT=0.6) at temperatures close to room temperature. Spot cooling to 77K may soon be practical for multi-stage coolers and may permit the use of Superconducting Quantum Interference Devices (SQUIDS) in place of GMR heads to detect magnetic signals. The channel signal to noise ratios may be further increased by cooling preamplifier circuits. As shown, the different TEC devices, SiGe+CN (a Silicon Germanium TEC device utilizing carbon nanotubes—carbon nanotubes are essentially heat pipes), SiGe SL (Silicon Germanium SuperLattices) and $Bi_2Te_3$ exhibit different ZTs, with SiGe+CN indicating the probable highest ZT at 3.0. Currently $Bi_2Te_3$ and $Bi_2Te_3/Sb_2Te_3$ have attained a ZT of 1.5. Utilizing the carbon nanotubes should increase the ZT to 3.0.

Cooling GMR heads utilizing TECs can significantly enhance magnetic sensing capacity of the GMR elements during the read operation and increase the performance of the write operation by lowering the copper coil resistance. Utilizing a TEC device to cool a read/write head makes it possible to use new GMR materials optimized for operations that have significantly higher (10–100x) sensitivities. Enhanced sensitivities may allow for higher density storage, thinner sensors, lower power consumption or higher speed sensing. A hard disk drive utilizing the TEC device doesn't need to be in partial vacuum for avoiding condensation, only dry air conditions have to be provided. Additionally, heat transferred from the write coils may be used to warm the surface of GMR head magnetic shields to improve the shielding performance.

While the invention has been particularly shown and described with reference to a preferred embodiment, it will be understood by those skilled in the art that various changes in form and detail may be made therein without departing from the spirit and scope of the invention.

What is claimed is:

1. A cooling apparatus, comprising:
    a thermoelectric cooling device;
    a heat transfer medium; and
    a data storage system component thermally coupled to said thermoelectric cooling device via said heat transfer medium for transferring heat from said data storage system component.

2. The apparatus of claim 1, wherein said thermoelectric cooling device comprises a material including semiconductor elements Bismuth and Telluride.

3. The apparatus of claim 1, wherein said thermoelectric cooling device comprises a material including Silicon and Germanium superlattices.

4. The apparatus of claim 1, wherein said heat transfer means comprises a diamond film thermally coupled with heat pipes.

5. The apparatus of claim 1, wherein said data storage system component comprises a read/write sensor.

6. The apparatus of claim 5, wherein said read/write sensor comprises a giant magnetoresistive sensor.

7. The apparatus of claim 1, wherein said data storage system component is a heat source within said system.

8. A cooling method, comprising the steps of:
    thermally coupling a thermoelectric cooling device to a heat transfer medium; and
    transferring heat from a data storage system component thermally coupled to said heat transfer medium by applying power to said thermoelectric cooling device.

9. The method of claim 8, further comprising:
    bonding said heat transfer medium to said component wherein said heat transfer medium comprises a diamond film.

10. The method of claim 9, further comprising:
    thermally coupling heat pipes to said diamond film for transferring heat from said component.

11. The method of claim 8, wherein said step of thermally coupling said thermoelectric cooling device to a heat transfer medium, alternatively comprises:
    forming said thermoelectric cooling device from a material including Silicon and Germanium superlattices.

12. The method of claim 8, wherein said step of providing a thermoelectric cooling device in thermal contact with said high thermal conductivity material, further comprises:

forming said thermoelectric cooling device from a material including Bismuth and Telluride.

13. The method of claim 8, further comprising:

utilizing said heat transfer medium and said thermoelectric cooling device for cooling a read/write sensor.

14. The method of claim 8, further comprising:

utilizing said heat transfer medium and said thermoelectric cooling device for cooling a heat producing component within the data storage system.

15. A data storage system, comprising:

a thermoelectric cooling device;

a heat transfer medium thermally coupled to said cooling device; and a data storage system component thermally coupled to said heat transfer medium wherein heat may be transferred from said component to said thermoelectric cooling device.

16. The system of claim 15, wherein said thermoelectric cooling device comprises a material including the elements Bismuth and Telluride.

17. The system of claim 15, wherein said thermoelectric cooling device comprises a material including Silicon and Germanium superlattices.

18. The system of claim 15, wherein said heat transfer means comprises a diamond film thermally coupled with heat pipes for removing heat from said component.

19. The system of claim 15, wherein said component comprises a read/write sensor of said hard disk drive.

20. The system of claim 15, wherein said component comprises an analog to digital converter component within said drive.

21. The system of claim 15, wherein said data storage system component comprises a heat source.

* * * * *